United States Patent
Onodera

[11] Patent Number: 5,856,774
[45] Date of Patent: Jan. 5, 1999

[54] HOLDING STRUCTURE FOR TERMINAL OF VARIABLE RESISTOR

[75] Inventor: Ichiro Onodera, Miyagi-ken, Japan

[73] Assignee: Alps Electric Co., Ltd., Tokyo, Japan

[21] Appl. No.: 891,305

[22] Filed: Jul. 10, 1997

[30] Foreign Application Priority Data

Jul. 12, 1996 [JP] Japan .................................. 8-203062

[51] Int. Cl.$^6$ .............................................. H01C 10/30
[52] U.S. Cl. ........................................................ 338/118
[58] Field of Search .................................. 338/202, 174, 338/184, 167, 169, 170, 171, 22

[56] References Cited

U.S. PATENT DOCUMENTS

| | | | |
|---|---|---|---|
| 3,914,727 | 10/1975 | Fabricius et al. | 338/220 |
| 4,310,824 | 1/1982 | Steigerwald | 338/174 |
| 4,884,052 | 11/1989 | Eitoku et al. | 338/202 |
| 4,928,083 | 5/1990 | Sims et al. | 338/202 |
| 5,059,940 | 10/1991 | Thomas et al. | 338/164 |
| 5,460,035 | 10/1995 | Pfaffenberger | 73/118.1 |

*Primary Examiner*—Teresa J. Walberg
*Assistant Examiner*—Jeffrey Pwu
*Attorney, Agent, or Firm*—Brinks Hofer Gilson & Lione

[57] ABSTRACT

In an electrical part, a first resilient portion of an internal terminal is inserted into a terminal guide portion, and the internal terminal is inserted into the terminal guide portion such that a contact portion thereof resiliently contacts the inner side of the terminal guide portion. A curved second contact portion of the internal terminal is formed at one end, and a stopper, disposed at the internal terminal 3, is retained in a recess of an external terminal to prevent the internal terminal 3 from being removed from the terminal guide groove. In conventional electrical parts, the internal terminal is connected to the insulating substrate at an eyelet or the like by staking in order to transfer the resistance change resulting from the rotation of the operating shaft to the outside, so that when staking at the eyelet or the like is done with too much strength, the insulating substrate may crack. The electrical part makes it possible to overcome such a problem of the conventional electrical parts.

6 Claims, 5 Drawing Sheets

HOLDING STRUCTURE FOR TERMINAL OF VARIABLE RESISTOR

BACKGROUND OF THE INVENTION

1. Field of the Invention

The present invention relates to an electric part, such as a throttle position sensor, used for setting the fuel supply amount in, for example, an automobile at an optimum amount in accordance with the travel speed in order to allow the automobile to travel with its fuel amount kept at the optimum amount.

2. Description of the Related Art

A description will be given of such an electric part, taking as an example the throttle position sensor disclosed in Japanese Unexamined Patent Publication No. 7-109935.

As shown in FIG. 6, a conventional electric part, such as a throttle position sensor, has a housing 11 including an accommodating portion 11a, an opening 11c formed at one end thereof in the direction of its shaft center line Z, and a cover portion 11d for sealing the opening 11c. The housing 11 also has a through hole 11e at the central portion thereof in the direction of the shaft center line Z. A metallic bearing 11g is provided at the through hole 11e, which is insert molded to the housing 11.

An operating shaft 12, made of insulating resin, has integrally formed at one end a sliding element supporting member 13 that rotates with the operating shaft 12, and is rotatably held by the bearing 11g. Sliding member pieces 13a are mounted to a surface of the sliding element supporting member 13 by staking or the like.

To the outside portion of the housing 11 at the other end of the operating shaft 12 are mounted a knob 14, a coil spring 15, an annular seal 16 and an insulating substrate 17. The knob 14 is mounted to the outside portion of the housing 11 by heat staking or the like. The coil spring 15, having one end mounted to the housing 11 and the other end mounted to the knob 14, functions to automatically return the operating shaft 12 in the direction of rotation thereof. The seal 16 is provided between the bearing 11g and the operating shaft 12. The insulating substrate 17 is disposed so as to oppose the sliding element supporting member 13.

A resistance pattern 17a is, for example, printed on a surface of the insulating substrate 17. Each of the sliding element pieces 13a slidably contact the resistance pattern 17a in order to change the resistance as the operating shaft 12 rotates, thus allowing the current or the voltage to be changed. A wave washer 18 is provided between the sliding element supporting member 13 and a protrusion 11h in the housing 11, such that the sliding element supporting member 13 is at all times urged towards the insulating substrate 17 in order to prevent the creation of play in the Z direction of the operating shaft 12.

In order to transfer the aforementioned change in resistance outside the device, one end of the internal terminal 19 is staked at an eyelet 19a or the like to the resistance pattern 17a printed on the insulating substrate 17, and the resistance pattern 17a and the internal terminal 19 are connected and fixed together. One end of the external terminal 20 inserted molded and mounted to the housing 11 is connected to the other end of the internal terminal 19 using solder 19b or the like. The resistance change is transferred to the outside of the device through the other end of the external terminal 20.

Such a conventional electrical part, or a throttle position sensors has the problem that a large number of manhours is required to assemble it, since the resistance change due to the rotation of the operating shaft 12 is transferred to the outside of the device by connecting the internal terminal 19 to the insulating substrate 17 at an eyelet 19a by staking or the like.

When staking is performed with too much strength at the eyelet 19a, the insulating substrate 17 may crack.

On the other hand, when staking is performed too weakly at the eyelet 19a, a play is created between the insulating substrate 17 and the internal terminal 19, resulting in the possibility of poor contact between the resistance pattern 17a and the internal terminal 19.

In addition, the task of assembling the electric part becomes complicated, since soldering must also be carried out using, for example, solder 19b to connect the internal terminal 19, mounted to the insulating substrate 17 at the eyelet 19a by staking or the like, and the external terminal 20 inserted molded to the housing.

In view of the above-described problems, according to a first form of the present invention, there is provided an electrical part, comprising: a hollow housing with an opening at one end and a wall surrounding the hollow; an external terminal having one end disposed in the hollow portion of the housing and the other end led out from the hollow portion of the housing; a tabular insulating substrate with a resistance pattern, which is disposed at the bottom portion of the housing; an internal terminal having a first resilient portion and a second resilient portion; and a recess-shaped terminal guide portion formed at one end of the external terminal so as to face the opening of the housing, wherein the first resilient portion of the internal terminal is inserted into and resiliently contacted with the terminal guide portion, and the second resilient portion of the internal terminal is resiliently contacted with the resistance pattern, in order to connect the external terminal and the internal terminal together.

According to a second form of the present invention, the terminal guide portion formed at one end of the external terminal may be formed by a flat portion and an opposing portion thereof of the external terminal, or a side wall of the housing and the opposing portion of the external terminal, or the flat portion of the external terminal and an opposing portion thereof of the housing.

According to a third form and a fourth form of the present invention, the electrical part may further comprise a stopper cut and raised from a flat portion of the internal terminal, wherein a recess is formed either in a flat portion of the external terminal which opposes the flat portion of the internal terminal or in a side wall of the housing, in order to retain the stopper in the recess.

DESCRIPTION OF THE PREFERRED EMBODIMENT

Figure 1:
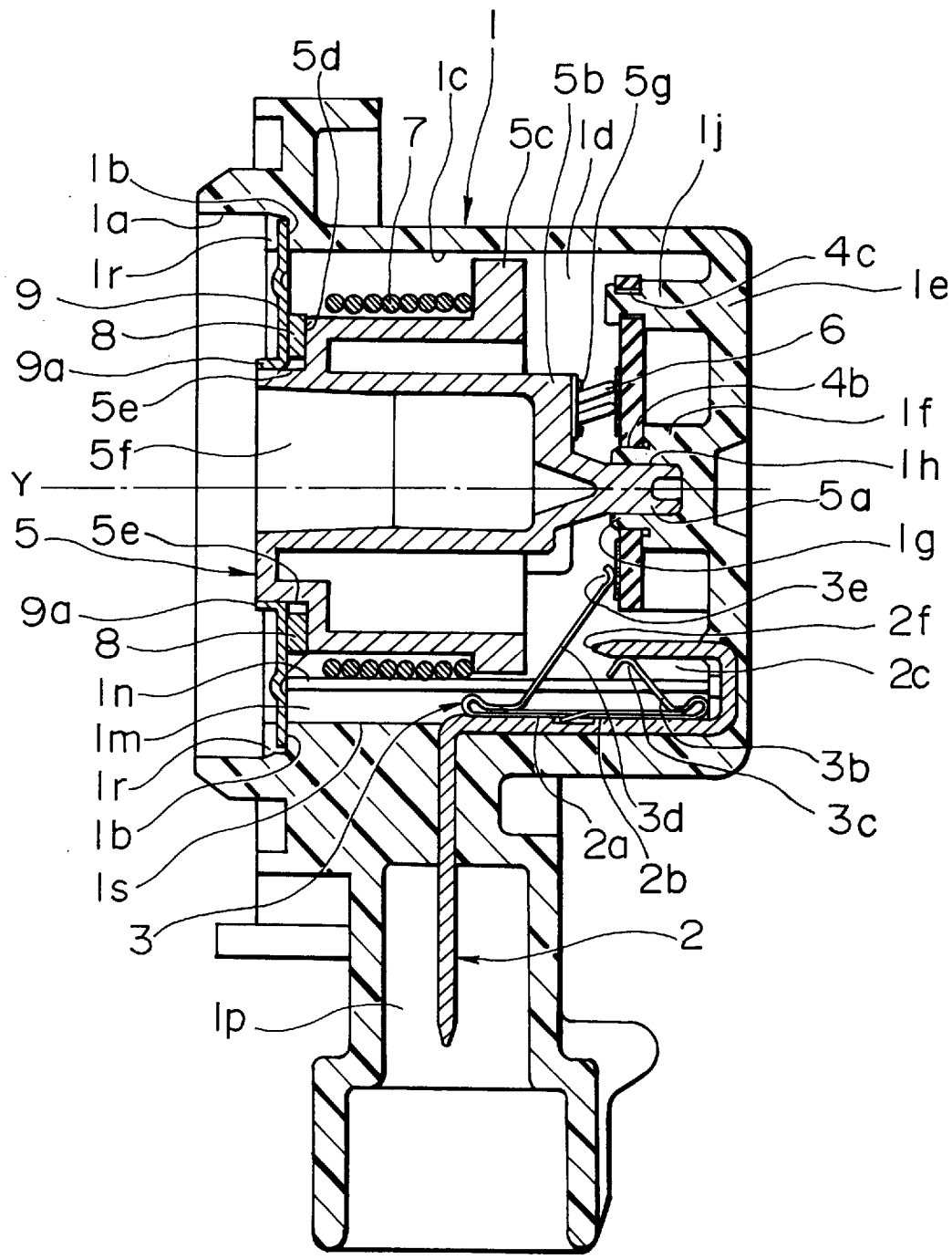
FIG. 1 is a sectional view of a throttle position sensor in accordance with the present invention.

A description will now be given of an embodiment of an electrical part in accordance with the present invention, taking as an example a throttle position sensor used, for example, in an automobile, with reference to FIGS. 1 to 5.

A housing 1 is formed from synthetic resin or the like into a substantially cylindrical shape. It has a step 1b at a cylindrical opening 1a at one end, and is closed by a bottom wall 1e at the other end. It has a hollow interior, which is designated hollow portion 1d. A bearing 1f protrudes into the hollow interior from the central portion of the inside face of the bottom wall 1e, and has a thin end 1g, forming a two-step structure. A bearing hole 1h is formed in the central portion of the end 1g into a predetermined diameter and depth. A plurality of stepped protrusions 1j are formed spaced apart from the bearing 1f.

Figure 2:
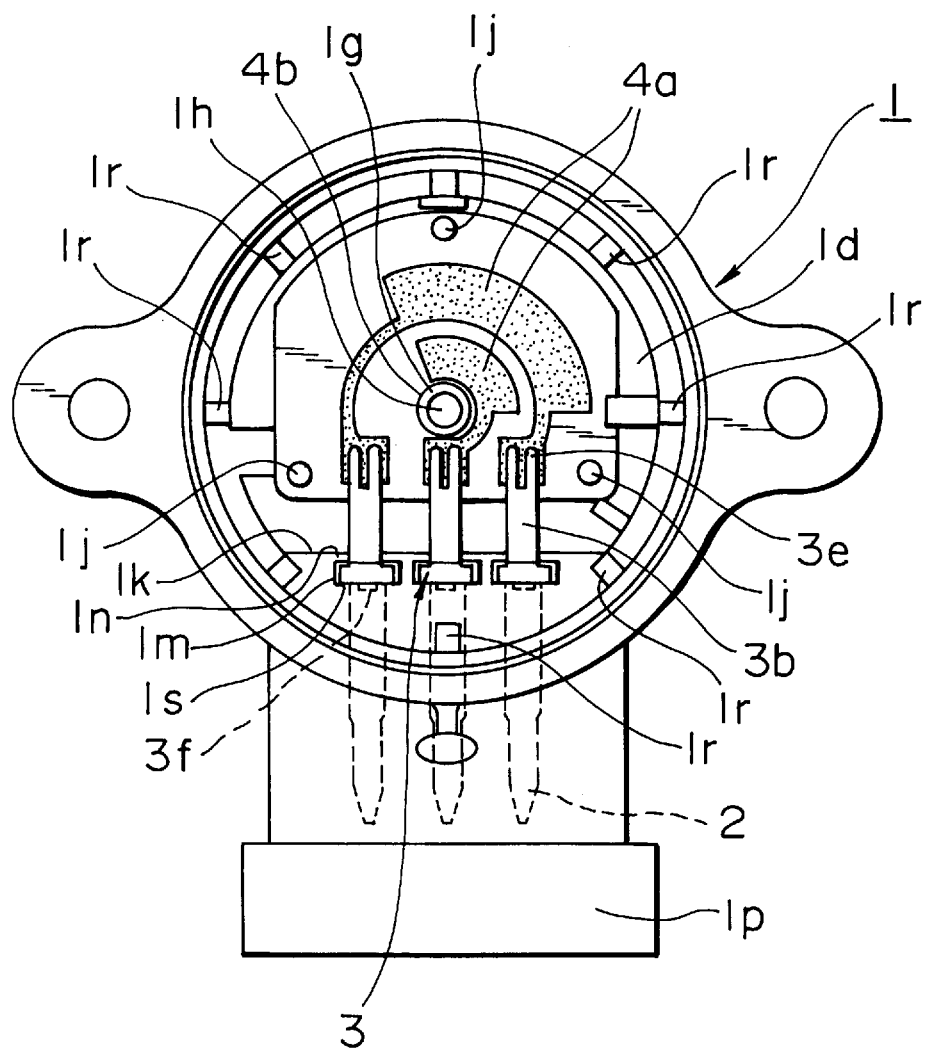
FIG. 2 is a left side view of an insulating substrate mounted to a housing, forming a unitary structure.

As shown in FIG. 2, a cylindrical wall 1c defines one side of the hollow portion 1d and a flat wall 1k defines the other side of the hollow portion 1d. A terminal guide groove 1m is formed into the shape of a key groove by an L-shaped thin wall 1n and a side wall, and extends to the inside wall of the bottom wall 1e in the direction of the shaft center line Y.

An external terminal 2, insert molded to the housing 1 is integrally mounted in the terminal guide groove 1m and to a portion of the bottom wall 1e at which the terminal guide groove 1m is located. The external terminal 2 is formed by a metal blank sheet which is bent by pressing or the like, with a rectangular recess 2b formed in its flat surface 2a.

At one end of the external terminal 2 is formed an opposing portion 2f that opposes the aforementioned flat surface 2a, is separated by a predetermined gap therefrom, and protrudes toward the opening 1a. The opposing portion 2f forms part of a terminal guide portion 2c and is insert molded to part of the bottom wall 1e.

The other end of the external terminal 2 protrudes into a terminal protective section 1p as a result of bending the flat surface 2a externally of the housing 1 at right angles and insert molding the base portion formed by the bending to the side wall 1s defining the terminal guide groove 1m. Here, the flat surface 2a of the external terminal 2, which is exposed to the hollow portion 1d, protrudes from the side wall 1s.

Figure 3:
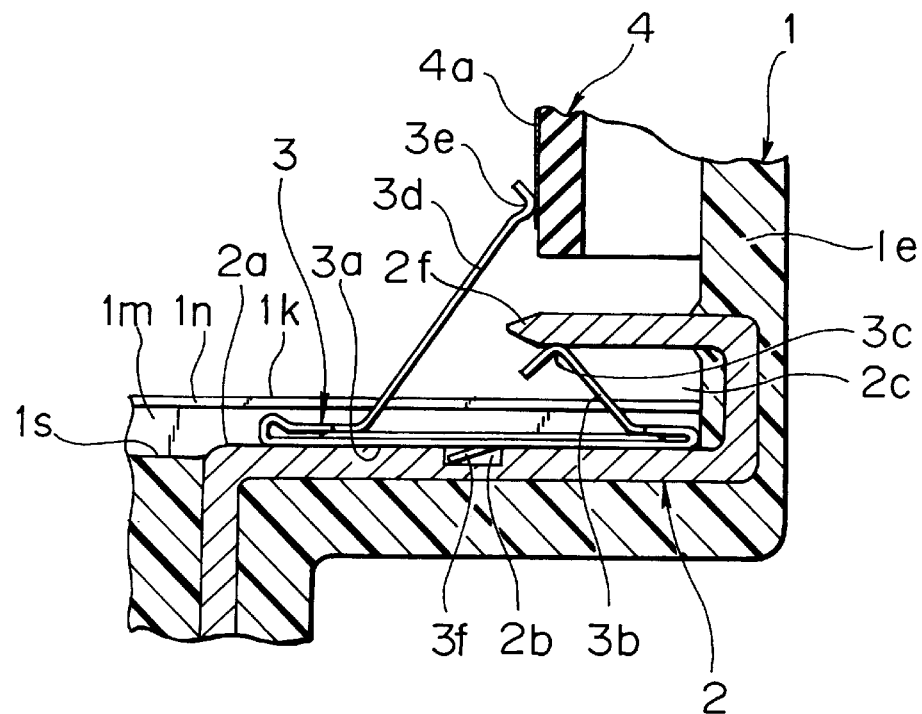
FIG. 3 is a main sectional view showing the portion where the internal terminal is mounted to the terminal guide section.
Figure 4:
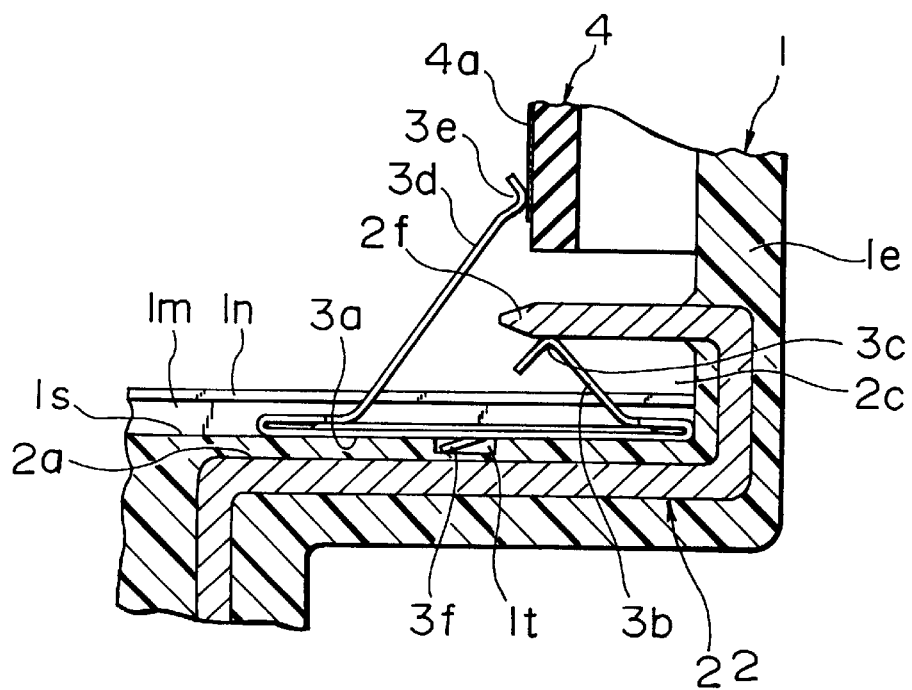
FIG. 4 is a main sectional view showing another embodiment of the portion where the internal terminal is mounted to the terminal guide section.

As shown in FIG. 3, an end of the internal terminal 3, made of a springy metal such as phosphor bronze, is inserted into the recess-shaped terminal guide section 2c facing the opening 1a. The internal terminal 3 is formed from one phosphor bronze plate and has a flat portion 3a. Both sides of the flat portion 3a are folded back inwardly in the longitudinal direction and parallel to each other, and then raised upward, forming a first resilient section 3b and a second resilient section 3d, respectively. A bent contact section 3c of the first resilient section 3b, which is inserted into the terminal guide section 2c, is brought into resilient contact with the opposing section 2f of the external terminal 2, while the flat section 3a of the internal terminal 3 is brought into resilient contact with the flat surface 2a of the external terminal 2. These two resilient contacts result in electrical connection of the external terminal 2 and the internal terminal 3.

At the other end of the internal terminal 3 is formed a curved contact section 3e at an end of the second resilient section 3d.

At the center portion of the flat portion 3a of the internal terminal 3 is formed a stopper 3f cut and raised from the back face of the flat portion 3a. The stopper 3f is retained in a recess 2b formed in the flat portion 2a of the external terminal 2 at a location where the flat portion 3a of the internal terminal 3 is exposed from the side wall 1s of the opposing housing 1, thereby preventing the internal terminal 3 from being removed from the terminal guide groove 2c.

The contact portion 3e resiliently contacts an end portion of an arcuate resistance pattern 4a printed on a surface of the tabular insulating substrate 4 made of ceramic or the like. The end 1g of the housing 1 is fitted into a through hole 4b in the central portion of the insulating substrate 4, and a protrusion 1j of the housing 1 is fitted into a through hole 4c in the outer periphery of the insulating substrate 4. An end of the protrusion 1j is, for example, subjected to heat staking in order to mount the insulating substrate 4 at the hollow portion 1d of the housing 1.

A rotary shaft 5a formed at one side of a rotor 5 formed from synthetic resin or the like is inserted into the bearing hole 1h, so that an end of the rotary shaft 5a is brought into contact with the bottom face of the bearing hole 1h, whereby the rotor 5 is rotatably held in the hollow portion 1d.

A flat sliding element supporting portion 5b is formed at the base portion of the rotary shaft 5a. A flange 5c is formed at the outer periphery of the rotor 5 at the side of the sliding element supporting portion 5b. A stepped portion 5d is formed at the other outer peripheral portion of the rotor 5. A rotating portion 5e is formed at an outer periphery of the rotor 5 that is located outwardly of the stepped portion 5d. A hollow hole 5f is formed in the rotor 5 with a predetermined diameter and depth.

At the flat face of the sliding element supporting portion 5b is mounted sliding member pieces 6 formed from a springy metal thin plate made of phosphor bronze or the like, forming a motor 5 unit, with the ends of the sliding member pieces 6 slidably contacting the resistance pattern 4a.

A coil spring, fixed at one end to the housing and at the other end to the flange 5c of the rotor 5, is wound and mounted at the outer periphery of the rotor 5 in order to automatically return the rotor 5 in the direction of rotation thereof.

A wave washer 8 is disposed at the stepped portion 5d of the rotor 5, and a bearing 9 composed of stainless plate or the like is disposed at the stepped portion 1b of the housing 1. At the central portion of the bearing 9 is formed a protruding bearing hole 9a by burring or the like in order to rotatably hold the rotating portion 5e of the rotor 5. The bearing 9 has a plurality of cutouts (not shown) formed in its outer periphery. The cutouts receive the protrusion 1r at the stepped portion 1b of the housing 1 in order to, for example, heat stake the protrusion 1r thereto.

In the construction of the throttle position sensor of the present invention, the rotor 5 is held between the bearing hole 1h in the bottom wall 1e of the housing 1 and the bearing hole 9a in the bearing 9, without any play in the direction of the shaft center line Y due to the resiliency of the wave washer 8.

When the throttle position sensor with such a construction is mounted to a vehicle body, and the accelerator pedal of the vehicle is operated, the rotor 5 rotates, causing the sliding member pieces 6 to slide along the surface of the resistance pattern 4a of the insulating substrate 4. This changes the resistance value, which allows detection of the throttle position therefrom.

In assembling the throttle position sensor, being an electrical part of the present invention with such a construction, when the insulating substrate 4 is inserted into the hollow portion 1d of the housing, with the opening 1a of the housing 1 and the resistance pattern 4a of the insulating substrate 4 faced upward, the through hole 4b of the insulating substrate 4 receives the end 1g of the bearing 1f formed at the bottom wall 1e and the through hole 4c of the insulating substrate 4 receives the projection 1j of the bottom wall 1e, whereby the insulating substrate 4 is positioned and mounted to the bottom wall 1e of the housing 1. The ends of the projections 1j protruding from the insulating substrate 4 are, for example, heat staked to fix the insulating substrate 4 in the hollow portion 1d of the housing 1.

As shown in FIG. 2, when the internal terminal 3 is inserted and pushed into the key-shaped terminal guide groove 1m within the flat wall 1k extending from the opening 1a of the housing 1 to the hollow portion 1d, the stopper 3f cut and raised from the center portion of the back face of the flat portion 3a contacts the side wall 1s, and the flat portion 3a is inserted obliquely to the side wall 1s. Further pushing of the internal terminal 3 causes the stopper 3f to contact the flat portion 2a of the external terminal 2. When the internal terminal 3 is pushed toward the bottom wall 1e, the contact portion 3c of the internal terminal 3 resiliently contacts the opposing portion 2f in the recess-shaped terminal guide portion 2c opposing the opening 1a, and the flat portions 2a and 3a of the external terminal 2 and the internal terminal 3 resiliently contact each other, whereby the internal terminal 3 is electrically connected to the two faces of the external terminal 2, that is the flat portion 2a and the opposing portion 2f. The internal terminal 3 is fixed in the terminal guide portion 2c, since the stopper 3f of the internal terminal 3, due to its resilience, slides into the recess 2b of the external terminal 2 and is prevented from being removed from the terminal guide portion 2c.

When the internal terminal 3 is fixed so as not to be removed from the terminal guide portion 2c, the contact portion 3e of the second resilient portion 3d of the internal terminal 3 slidably contacts an end portion of the resistance pattern 4a formed on the surface of the insulating substrate 4, whereby the resistance pattern 4a and the internal terminal 3 are electrically connected together. When the contact portion 3e resiliently contacts the resistance pattern 4a, the base portion formed as a result of bending a plate to form the second resilient portion 2 resiliently contacts the flat portion 3a, thereby ensuring connection of the two flat portions 2a and 3a.

When the sliding member pieces 6 are mounted to the protrusion 5g at a flat face of the sliding element supporting member 5b, and a rotor 5, formed into a unit by mounting an end of the coil spring 7 to the flange 5c, is inserted from its rotary shaft 5a side into the hollow portion 1d from the opening 1a of the housing to fit the rotary shaft 5a into the bearing hole 1h of the housing 1, an end of the rotary shaft 5a bumps into the bottom of the bearing hole 1h and stops there. Here, the sliding element pieces 6 resiliently contact the arcuate resistance pattern 4a of the insulating substrate 4, resulting in electrical connection between the resistance pattern 4a and the sliding element pieces 6.

When the other end of the coil spring 7 is retained at a predetermined location of the housing by making use of the resilience of the coil spring 7 in the rotational direction thereof in such a condition, the rotor 5 is prevented from rotating in one direction, thereby temporarily stopping it in the hollow portion 1d of the housing 5.

The wave washer 8 is disposed at the stepped portion 5d of the rotor 5, and from above the washer 8 the bearing 9 is guided and inserted into the opening 1a, followed by insertion of the rotating portion 5e of the rotor 5 into the bearing hole 9a of the bearing 9. Here, the protrusion 1r at the stepped portion 1b of the housing 1 engages the plurality of cutouts in the outer periphery of the bearing 9, but there is a gap between the bearing 9 and the stepped portion 1b of the housing 1 due to the resilience of the wave washer 8. Pushing the bearing 9 downward against the resilience of the wave washer 8 causes the bearing 9 to contact the stepped portion 1b of the housing 1, so that the bearing 9 does not move in the direction of the shaft center line Y any further.

In this condition, when the protrusion 1r of the housing 1 is subjected to, for example, heat staking, the bearing 9 is fixed to the housing 1, thereby completing the assembly of the throttle position sensor of the present invention.

Here, the movement of the rotor 5 in the direction of the shaft center line Y is limited by the bearing hole 1h at the bottom wall 1e side of the housing 1 and the bearing hole 9a of the bearing 9. However, it is rotatably mounted in the hollow portion 1d of the housing 1. This ends the assembly of the throttle position sensor of the present invention.

In the present embodiment, the recess-shaped terminal guide portion 2c facing the opening 1a is formed by the flat portion 2a of the external terminal 2 and the opposing portion 2f of the external terminal 2 which faces the flat portion 2c. The flat portion 3a of the internal terminal 3 is resiliently contacted with the flat portion 2a of the external terminal 2 and the contact portion 3c of the internal terminal 3 is resiliently contacted with the opposing portion 2f of the external terminal 2. In another embodiment, illustrated in FIG. 4, however, the flat portion 2a of the external terminal 2 may be embedded in the side wall 1s, with a recess 1t formed in a portion of the side wall 1s which opposes the flat portion 3a of the internal terminal 3. In this embodiment, the stopper 3f is retained by the recess 1t, and the C-shaped terminal guide portion 2c of the external terminal 2 is formed at one end of the external terminal 2 by the side wall 1s of the housing 1, and the opposing portion 2f of the external terminal 2 which opposes the side wall 1s. The contact portion 3c of the internal terminal 3 is resiliently contacted with the opposing portion 2f of the external terminal 2 in order to electrically connect them together.

Figure 5:
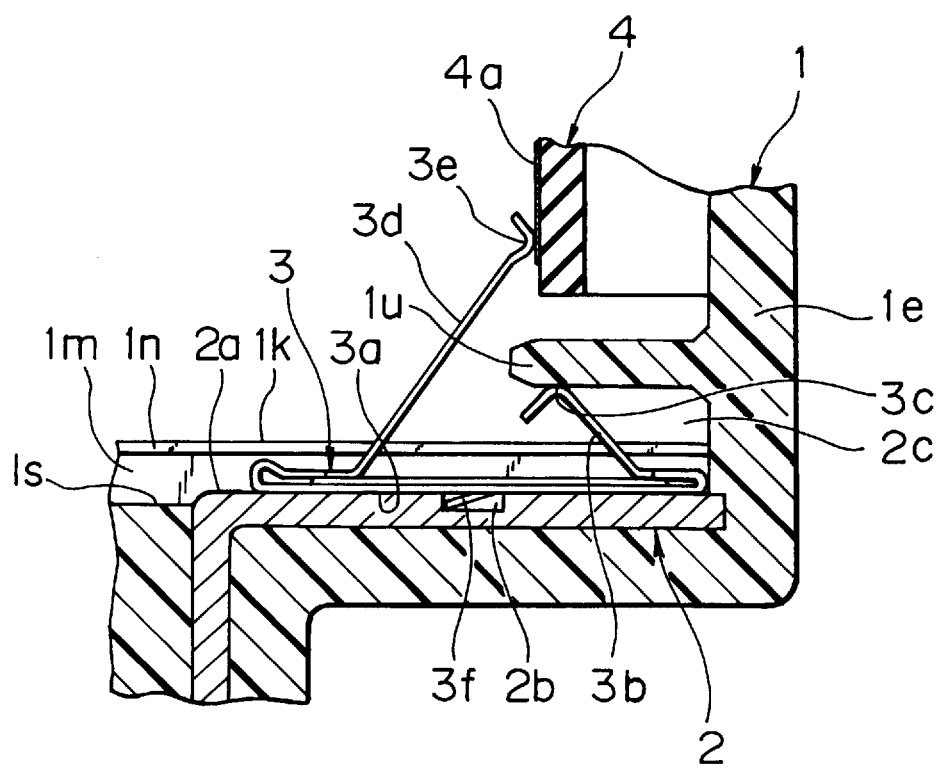
FIG. 5 is a main sectional view showing still another embodiment of the portion where the internal terminal is mounted to the terminal guide section.
Figure 6:
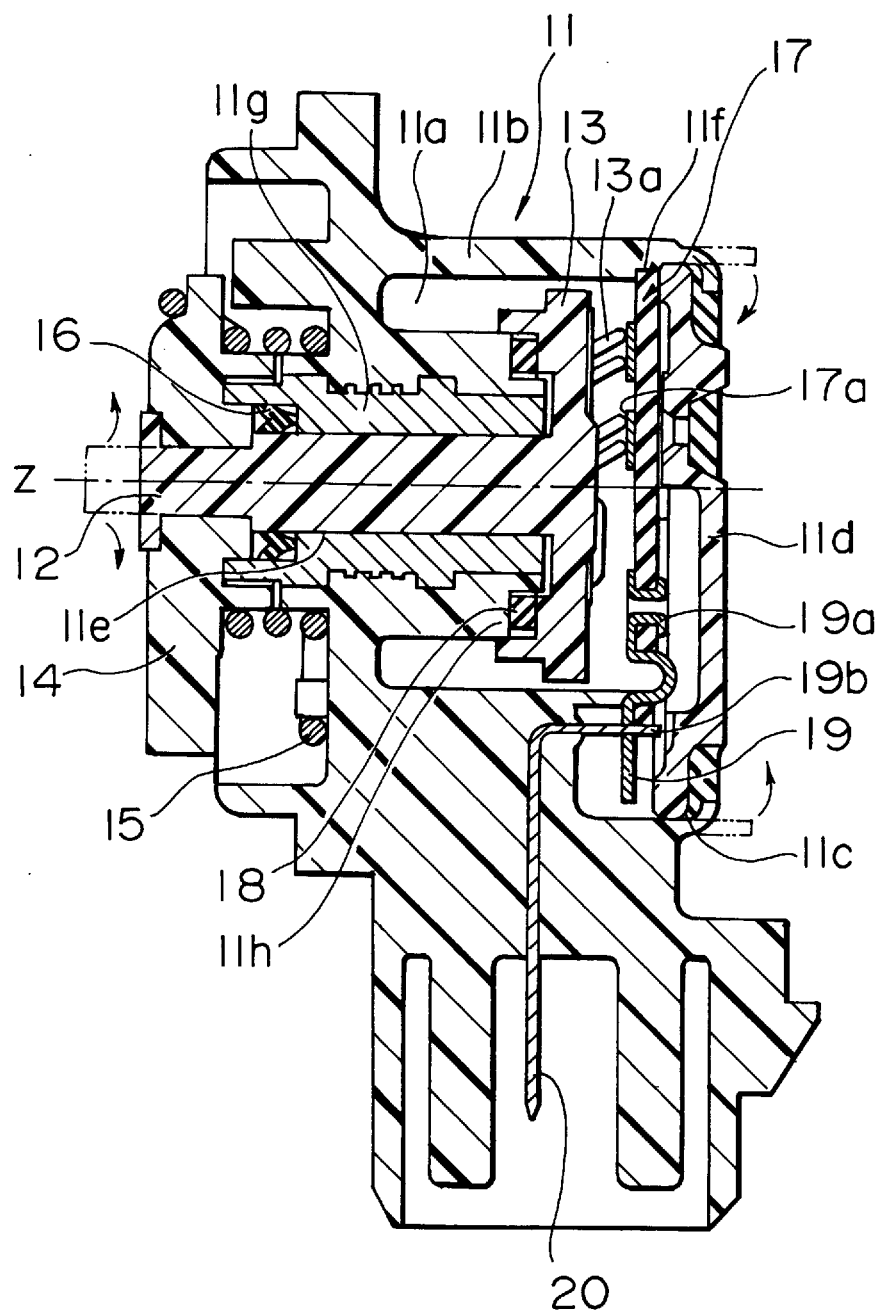
FIG. 6 is a sectional view of a conventional throttle position sensor.

In another embodiment illustrated in FIG. 5, the flat portion 2a of the external terminal 2, as with the present embodiment, has a recess 2b in the side of the flat portion 2a of the external terminal 2 which opposes the flat portion 3a of the internal terminal 3. The stopper 3f is retained by the recess 2b, and the terminal guide portion 2c of the external terminal 2 is formed at one end of the external terminal 2 by the flat portion 2a of the external terminal 2, and a protrusion 1u formed integrally with the bottom wall 1e of the housing 1 and opposing the flat portion 2a. The flat portion 3a of the internal terminal 3 and the flat portion 2a of the external terminal are electrically connect by resiliently contact them together.

More specifically, the recess-shaped terminal guide portion 2c facing the opening 1a is formed at one end of the external terminal 2. In the embodiments illustrated in FIGS. 1 and 3, the terminal guide portion 2c is formed by the flat portion 2a of the external terminal 2 and the opposing portion 2f of the external terminal 2 which faces the flat portion 2a. In the embodiment illustrated in FIG. 4, the terminal guide portion 2c is formed by the side wall 1s of the housing 1 and the opposing portion 2f of the external terminal 2 which opposes the side wall 1s. In the embodiment illustrated in FIG. 5, the terminal guide portion 2c is formed by the flat portion 2a of the external terminal 2 and the opposing portion 1u of the housing 1 which opposes the flat portion 2a.

As can be understood from the foregoing description, the electric part of the present invention can be easily assembled by simply inserting the internal terminal into the terminal guide portion and connecting the resistance pattern and the external terminal together. This is achieved by inserting the first resilient portion of the internal terminal into the recessed-shaped terminal guide portion facing the opening 1a and resiliently contacting it therewith, and resiliently contacting the second resilient portion of the internal terminal with the resistance pattern, in order to connect the resistance pattern and the external terminal together. In addition, the electric part can be easily assembled, thereby enhancing yield, since it becomes unnecessary to perform staking at an eyelet or the like, which may cause cracking of the insulating substrate, and soldering of the external terminal and the internal terminal together.

The terminal guide portion can be formed in a variety of ways at one end of the external terminal. It can be formed by a flat portion of the external terminal and an opposing portion thereof of the external terminal, or a side wall of the housing and an opposing portion thereof of the external terminal, or the flat portion of the external terminal and an opposing portion thereof of the housing. Therefore, the type of terminal guide portion can be freely selected according to different purposes, such as using cheap material, or using an external terminal and a housing with good processability, or forming the terminal guide portion by a simple assembly operation.

The electric part can also be easily assembled, since the internal terminal can be easily inserted into the terminal guide portion and mounted thereto by providing a stopper cut and raised from the flat portion of the internal terminal, and forming a recess in either the flat portion of the external terminal which faces the flat portion of the internal terminal or a side wall of the housing, and retaining the stopper in the recess. In addition, the electrical part makes it possible to make stable connections, since the external terminal and the internal terminal are not disconnected from each other, when vibration or the like is applied from the outside. This is achieved because the internal terminal can be reliably retained in the recess of the external terminal.

What is claimed is:

1. An electrical part, comprising:

a hollow housing with an opening at one end, a bottom portion opposing said opening, and a wall surrounding a hollow portion;

an external terminal having one end disposed in the hollow portion of said housing and the other end being disposed externally of said housing;

a tabular insulating substrate with a resistance pattern, which is centrally disposed at the bottom portion of said housing and opposes said opening;

an internal terminal having a first resilient portion and a second resilient portion, the first resilient portion contacting the second resilient portion; and a recess-shaped terminal guide portion disposed at one end of said external terminal so as to face the opening of said housing, the terminal guide portion extending outside of the insulating substrate and comprising a portion of the external terminal, wherein the first resilient portion of said internal terminal is disposed at the bottom portion of the housing and is inserted into and resiliently contacted with said terminal guide portion, and the second resilient portion of said internal terminal is located towards the opening of said housing and is resiliently contacted with the resistance pattern, in order to connect said external terminal and said internal terminal together.

2. An electrical part according to claim 1, wherein said terminal guide portion comprises a flat portion and an opposing portion thereof of said external terminal.

3. An electrical part according to claim 1, further comprising a stopper, the stopper being cut and raised from a flat portion of said internal terminal, wherein a recess is disposed in a flat portion of said external terminal which opposes the flat portion of said internal terminal in order to retain said stopper in the recess.

4. An electrical part according to claim 1, wherein said terminal guide portion comprises a flat portion and a side wall of said housing and the opposing portion of said external terminal.

5. An electrical part according to claim 1, wherein said terminal guide portion comprises the flat portion of said external terminal and an opposing portion thereof of said housing.

6. An electrical part according to claim 1, further comprising a stopper, the stopper being cut and raised from a flat portion of said internal terminal, wherein a recess is disposed, in a side wall of said housing, in order to retain said stopper in the recess.

* * * * *